(12) United States Patent
Biberger et al.

(10) Patent No.: US 10,279,419 B2
(45) Date of Patent: May 7, 2019

(54) METHODS AND SYSTEMS FOR RASTER SCANNING A SURFACE OF AN OBJECT USING A PARTICLE BEAM

(71) Applicant: Carl Zeiss Microscopy GmbH, Jena (DE)

(72) Inventors: Josef Biberger, Wildenberg (DE); Ralph Pulwey, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 649 days.

(21) Appl. No.: 13/741,677

(22) Filed: Jan. 15, 2013

(65) Prior Publication Data

US 2013/0180962 A1   Jul. 18, 2013

(30) Foreign Application Priority Data

Jan. 16, 2012   (DE) .......................... 10 2012 000 650

(51) Int. Cl.
 *B23K 15/00*   (2006.01)
 *H01J 37/304*   (2006.01)
 (Continued)

(52) U.S. Cl.
 CPC .............. *B23K 15/00* (2013.01); *B23K 15/08* (2013.01); *H01J 37/304* (2013.01); *H01J 37/3053* (2013.01); *H01J 2237/30488* (2013.01)

(58) Field of Classification Search
 CPC ..... C23C 14/30; C23C 14/246; C23C 14/243; H01J 37/3053; H01J 37/305; H01J 37/304; H01J 2237/30488; H01J 37/06; H01J 37/073; H01J 37/185; H01J 37/20; H01J 37/222; H01J 37/244; H01J 37/28;
 (Continued)

(56) References Cited

U.S. PATENT DOCUMENTS 3,748,470 A * 7/1973 Barrett .............................. 378/2
3,829,838 A * 8/1974 Lewis ................ G02B 27/2271
345/419

(Continued)

FOREIGN PATENT DOCUMENTS

WO       9428547 A1    12/1994

OTHER PUBLICATIONS

L. Reimer, Scanning Electron Microscopy, Physics of Image Formation and Microanalysis, Springer-Verlag, 1985, pp. 119-123.
(Continued)

*Primary Examiner* — Ibrahime A Abraham
*Assistant Examiner* — Gyounghyun Bae
(74) *Attorney, Agent, or Firm* — Fish & Richardson P.C.

(57) ABSTRACT

A method of raster scanning a surface of an object using a particle beam comprises determining a basic set of raster points within a surface; determining a surface portion of the surface of the object, wherein the surface portion is to be raster scanned; ordering a set of raster points of the basic set located within the surface portion; and scanning of the surface portion by directing the particle beam onto the raster points of the ordered set in an order corresponding to an order of the raster points in the ordered set from the outside to the inside, i.e. starting from the boundary of the surface portion towards its center, or in the reverse order, i.e. from the inside to the outside.

17 Claims, 11 Drawing Sheets

(51) Int. Cl.
*H01J 37/305* (2006.01)
*B23K 15/08* (2006.01)

(58) Field of Classification Search
CPC ........... H01J 2237/082; H01J 2237/202; H01J 2237/20228; H01J 2237/204; H01J 2237/22; H01J 2237/24564; H01J 2237/2806; H01J 2237/2816; H01J 2237/2817; B23K 15/00; B23K 15/08; G01N 23/225

USPC ............ 219/121.15, 121.18, 121.71, 121.64, 219/121.14; 250/311, 306, 307, 309, 310, 250/336.1, 345.1, 282, 285, 301, 302, 250/304, 305, 440.11, 441.11, 442.11, 250/443.11, 340–342, 347–354.1, 250/362–366, 367–370.02, 371, 374–388, 250/391, 395, 423 R, 424, 458.1–459.1, 250/472.1–488.1, 489, 491.1, 250/492.1–519.1; 264/1.27, 400

See application file for complete search history.

(56) References Cited

U.S. PATENT DOCUMENTS

| | | | |
|---|---|---|---|
| 4,529,882 A * | 7/1985 | Lee | 250/363.1 |
| 4,546,232 A | 10/1985 | Beisswenger et al. | |
| 4,800,100 A * | 1/1989 | Herbots | C23C 14/221 117/105 |
| RE33,931 E * | 5/1992 | Whitney | 355/53 |
| 5,137,662 A * | 8/1992 | Hull et al. | 264/401 |
| 5,446,798 A * | 8/1995 | Morita | G06T 7/0022 348/142 |
| 5,610,967 A * | 3/1997 | Moorman | A61B 6/06 378/141 |
| 6,133,986 A * | 10/2000 | Johnson | 355/67 |
| 6,212,298 B1 * | 4/2001 | Yoshii | G06K 9/00429 382/193 |
| 6,624,879 B2 * | 9/2003 | Imai | G03F 7/70641 355/53 |
| 6,628,819 B1 * | 9/2003 | Huang | G06T 7/0071 345/419 |
| 6,649,914 B1 * | 11/2003 | Moorman et al. | 250/363.06 |
| 6,731,803 B1 * | 5/2004 | Aharonson | G06K 9/222 382/186 |
| 6,903,798 B2 * | 6/2005 | Shirota et al. | 355/18 |
| 6,947,057 B2 * | 9/2005 | Nelson | G06T 11/40 345/441 |
| 7,115,209 B2 * | 10/2006 | Grimard | B41J 2/442 216/28 |
| 7,230,677 B2 * | 6/2007 | Baselmans et al. | 355/67 |
| 7,525,104 B2 * | 4/2009 | Harada | A61N 5/10 250/396 R |
| 7,936,445 B2 * | 5/2011 | Hintersteiner et al. | 355/67 |
| 8,958,052 B2 * | 2/2015 | Sandstrom | G02F 1/33 355/53 |
| 2002/0066863 A1 * | 6/2002 | Chao | H01J 37/3005 250/397 |
| 2002/0074494 A1 * | 6/2002 | Lundquist | H01J 37/304 250/307 |
| 2002/0130262 A1 * | 9/2002 | Nakasuji et al. | 250/311 |
| 2002/0146172 A1 * | 10/2002 | Nair | G06K 9/20 382/195 |
| 2003/0006217 A1 | 1/2003 | Dance | |
| 2004/0189666 A1 * | 9/2004 | Frisken | G06T 11/001 345/611 |
| 2005/0238232 A1 * | 10/2005 | Ying | G06K 9/00201 382/170 |
| 2009/0041337 A1 * | 2/2009 | Nakano | G06K 9/00798 382/154 |
| 2009/0121157 A1 * | 5/2009 | Moffatt et al. | 250/492.2 |
| 2009/0179161 A1 * | 7/2009 | Ward | B82Y 10/00 250/492.21 |
| 2010/0127431 A1 * | 5/2010 | Sandstrom | 264/400 |
| 2010/0317140 A1 * | 12/2010 | Brailove et al. | 438/57 |
| 2012/0112089 A1 * | 5/2012 | Lang | H01J 37/02 250/396 R |

OTHER PUBLICATIONS

H.W.P. Koops et al.: "High-resolution electron-beam induced deposition", Journal of Vacuum Science and Technology B, vol. 6, No. 1, Jan./Feb. 1988, pp. 477-481.

W.C.L. Hopman et al., "Focused ion beam scan routine, dwell time and dose optimizations for submicrometre period planar photonic crystal components and stamps in silicon", Nanotechnology 18, 2007, pp. 1-11.

A. Yasaka et al., "Application of vector scanning in focused ion beam photomask repair system", J. Vac. Sci. Technol., vol. 26, No. 6, 2008, pp. 2127-2130.

Office Action in German patent application No. 10 2012 000 650.0 dated Sep. 25, 2012 (with English language translation).

C.S. Kim et al., "Fabrication of silicon micro-mould for polymer replication using focused ion beam", Microelectronic Engineering, vol. 86, No. 4-6, 2009, pp. 556-560.

J. Sun et al., "Fabrication of Freeform Micro Optics by Focused Ion Beam", Key Engineering Materials, Proceedings of Precision Engineering and Nanotechnolgy, vol. 516, 2012, pp. 414-419.

Extended European search report in European patent application No. 13 000 219.9 dated Sep. 4, 2013.

* cited by examiner

METHODS AND SYSTEMS FOR RASTER SCANNING A SURFACE OF AN OBJECT USING A PARTICLE BEAM

CROSS-REFERENCES TO RELATED APPLICATION

This application claims priority under 35 USC 119 of German Patent Application No. 10 2012 000 650.0, filed Jan. 16, 2012, the entire contents of which are incorporated by reference herein.

FIELD

The present invention relates to methods and systems configured to raster scan a surface of an object using a particle beam.

BACKGROUND

Particle beams are used to manipulate objects, wherein the objects are in particular miniaturized objects. For example, a particle beam can be directed onto the surface of the object in order to remove material from the object or to deposit material on the object. Such processing can be enhanced by supplying a process gas which is activated by the particle beam such that reaction products of the process gas are deposited on the surface of the object at the location of incidence of the particle beam, or that reaction products of the process gas are bound to the material of the object at the location of incidence of the particle beam, wherein resulting compounds are released from the object. The particle beam can be an electron beam or an ion beam.

It is a common task in the field of manipulating miniaturized objects to remove material from or deposit material on a predetermined surface portion of an object by scanning a particle beam across the surface portion line by line.

It has been found that the results achieved by such line scan across a surface portion of an object do not quite fulfill the expectations.

SUMMARY

It is an object of the present invention to provide methods and systems for raster scanning a particle beam across a surface of an object which can be advantageous relative to conventional methods and systems.

According to some embodiments, a method of raster scanning a surface of an object using a particle beam comprises: determining of a basic set of raster points within a surface; determining a surface portion of the surface of the object, wherein the surface portion is to be raster scanned; determining an ordered set of raster points by ordering a set of all raster points of the basic set which are located within the surface portion; and scanning of the surface portion by directing the particle beam onto the raster points of the ordered set in an order corresponding to an order of the raster points in the ordered set; wherein a distance of a raster point Pi from a boundary of the surface portion is smaller than a distance of a raster point Pj from the boundary of the surface portion for more than 50% of all pairs of raster points Pi, Pj of the ordered set for which raster point Pi is less than raster point Pj according to the order of the raster points in the ordered set.

In the conventional method where the line scan is performed, the order in which individual locations on the surface of the object are scanned is predetermined and known from the outset. This is different in the embodiments illustrated above where the order in which individual locations are scanned is a result of a shape of the surface portion to be scanned.

In the conventional method using the line scan in which subsequent raster points are scanned along lines from left to right, for example, and in which subsequent lines are scanned from top to bottom, for example, the scanning order is predetermined in that sense that for each possible pair of scanned raster points the following holds: if the raster points of the pairs are located on a same line, the raster point of the pair located to the right of the other raster point of the pair is scanned later than the other raster point. Moreover, if the raster points of the pair are located on different lines, the raster point of the pair located below of the other raster point of the pair is scanned later than the other raster point.

According to the embodiments illustrated above, the scan order of raster points is determined by the shape of the surface portion to be scanned in the sense that the raster points to be scanned are first ordered according to a an ordering strategy which depends on the shape of the surface portion to be scanned, and these raster points are then scanned in an order corresponding to the order of the ordered raster points. When the raster points are ordered, the distance of each individual raster point from the boundary of the surface portion to be scanned is an essential parameter. For a large number of pairs of raster points, and in particular for more than 50% of all possible pairs of raster points, the following holds: the raster point of the pair which is located before the other raster point of the pair according to the order is located closer to the boundary of the surface portion than the other raster point. This criterion is not necessarily fulfilled for all possible pairs of raster points. However, this criterion is fulfilled for a large number of the possible pairs of raster points, and, in particular for more than 20%, more than 30%, more than 40%, more than 50%, more than 60% or more than 70% of all possible pairs of raster points to be scanned.

Thus, the raster points are ordered such that the raster point occurring earlier in the search order is located closer to the boundary of the surface portion to be scanned than raster point occurring later in the order.

Subsequent to the determination of the order of the raster points, the particle beam is directed to the individual raster points in an order which corresponds to the order of the raster points. Accordingly, there are two options. According to the first option, the particle beam is directed to the raster points in an order conforming with the order of the raster points, such that the following holds for all possible pairs of raster points of the ordered set of raster points: the particle beam is directed to a first raster point of the pair at an earlier point in time than to the second raster point of the pair if the second raster point is located after the first raster point according to the order of the ordered set of raster points. According to the second option, the particle beam is directed to the raster points according to a reverse order of the ordered set such that the following holds for all possible pairs of raster points of the ordered set of raster points: the particle beam is directed to a first raster point of the pair at a later point in time than to the second raster point of the pair if the second raster point is located after the first raster point according to the order of the ordered set of raster points.

According to the first option, the particle beam is at first directed to the raster points located very close to the boundary of the surface portion to the scanned, it is then directed to those remaining raster points which are located a bit farther away from the boundary of the surface portion, it is then be directed to those remaining raster points which have not yet been scanned and which are located still farther away from the boundary of the surface portion, and the particle beam will finally be directed to those remaining raster points located farthest away from the boundary of the surface portion to be scanned which means to those raster points located in the center of the surface portion. The raster points are scanned from the outside to the inside, accordingly.

According to the second option, an inverse process is performed such that the raster points located farthest away from the boundary of the surface portion to be scanned and which are located close to the center of the surface portion are scanned first, then those remaining raster points which have not yet been scanned and which are located a bit closer to the boundary of the surface portion are scanned. Thereafter, those remaining raster points which have not yet been scanned and which are located even closer to the boundary of the surface portion are scanned, and finally those remaining raster points are scanned which are located very close to the boundary of the surface portion to be scanned. The raster points of the surface portion are scanned from the inside to the outside, accordingly.

The scanning order of the surface portion from the inside to the outside has an advantage in some applications in which material is removed from the object within the surface portion. The scan order results in a well defined edge of the removed material at the object, since a temporal distance between times at which pairs of raster points located close to the boundary of the surface portion is smaller than a temporal distance between pairs of raster points in which one raster point is located at the boundary of the surface portion and the other is located farther away from the boundary of the surface portion or even at the center of the surface portion. When material is removed from the object using a particle beam a problem may arise in practice: a portion of the material removed from the object at the location of incidence of the particle beam is deposited at some other location on the surface of the object. It may happen that removed material is deposited at regions of the surface portion which have already been scanned. By scanning the surface portion according to the order illustrated above from the inside to the outside, wherein the boundary of the surface portion is scanned last, a deposition of already removed material in a region close to the boundary of the surface portion can be essentially avoided since the boundary of the surface portion to be scanned is scanned last.

Using the illustrated methods, it is generally possible to achieve a relatively homogeneous processing of the surface portion to be processed.

According to exemplary embodiments, the raster points of the basic set are arranged in a predetermined regular two-dimensional rectangular lattice having first and second generating lattice vectors. According to some embodiments herein, the boundary of the surface portion to be scanned includes regions in which the boundary extends transverse to the first and second lattice vectors. In particular, in such regions, an angle between the direction of extension of the boundary and each of the lattice vectors is greater than 10° and less than 80°.

According to other embodiments, the raster points of the basic set are not arranged in a regular two-dimensional rectangular lattice. For example, the raster points of the basic set can be arranged in a regular lattice having lattice vectors which are not oriented orthogonal to each other. It is further possible that the raster points are arranged in a regular lattice having generating lattice vectors which can be oriented orthogonally relative to each other and wherein more than one raster point is located within the primitive cell of the lattice. An example of such lattice is a hexagonal lattice. It is further possible that the basic set of raster points is not arranged according to a regular lattice such that a periodic primitive cell can not be found for the arrangement of raster points on the surface. One example for such arrangement of raster points is an arrangement in which distances between adjacent raster points are randomly varied.

According to some embodiments, the method is performed such that the particle beam is directed to each raster point exactly one time. According to alternative embodiments, the particle beam is directed to each raster point plural times. According to some embodiments herein, the particle beam is directed to each raster point a same number of times.

According to further exemplary embodiments, the particle beam is directed to each raster point such that it remains directed onto the raster point during a predetermined dwell time. According to some embodiments herein, such dwell time is substantially greater than a time required to change the location of incidence of the particle beam from one raster point to the next raster point. In particular, such raster scanning is different from a continuous scan, where the location of incidence of the particle beam on the surface is continuously moved across the without maintaining the location of incidence constant at a raster point for a certain dwell time.

According to some exemplary embodiments, the particle beam is an electron beam.

According to other exemplary embodiments, the particle beam is an ion beam.

It is further possible to apply the illustrated principles to a system in which a laser beam is used to manipulate an object by locally supplying energy to the object using the laser beam. An ordered set of raster points on the object is first determined, and the raster points are then scanned using the laser beam in an order corresponding to the order of the set.

According to further exemplary embodiments, a process gas is supplied to the object together with the particle beam.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
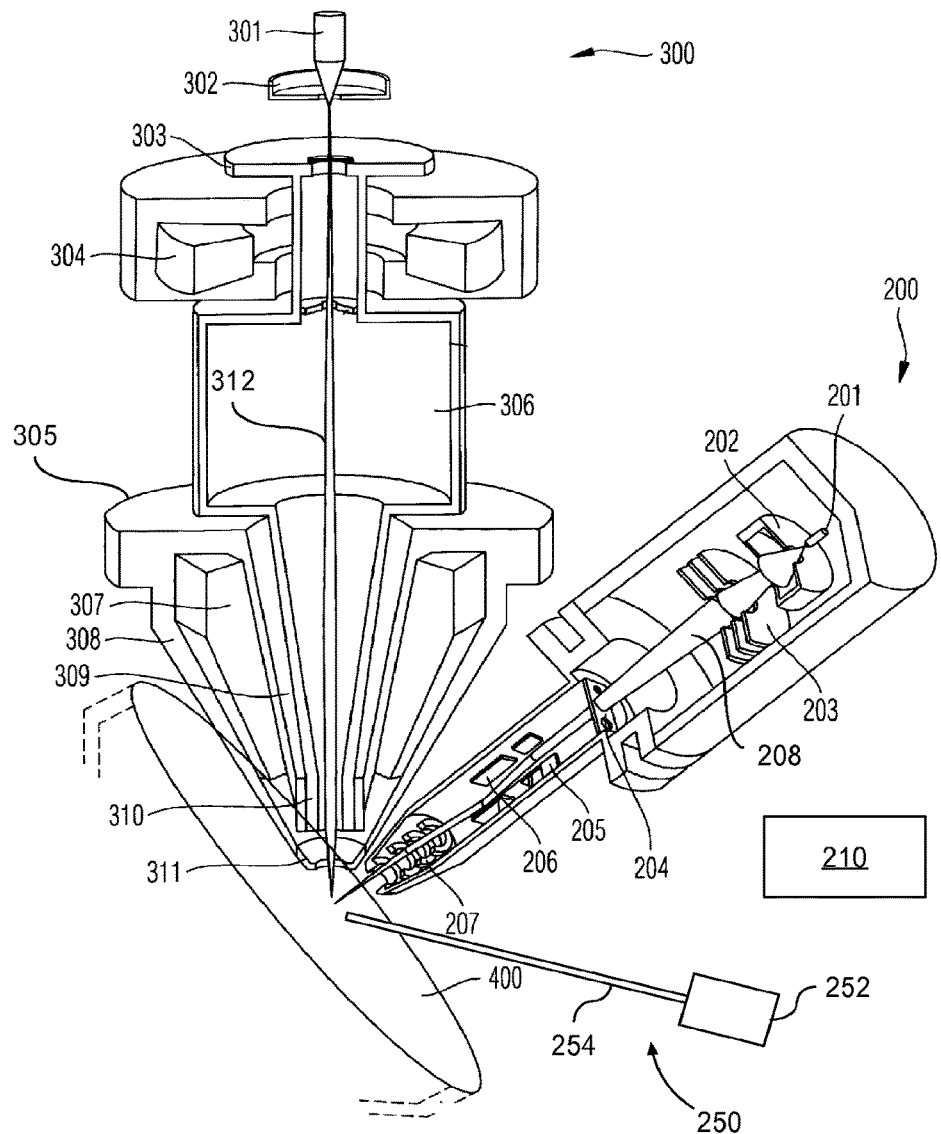
FIG. 1 is a schematic illustration of a particle beam system for scanning a surface of an object.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 is a simplified schematic illustration of a system for processing and inspecting an object 400 using particle beams. The system comprises an electron microscopy system 300 for imaging a region of the object 400 and an ion beam processing system 200 for manipulating the object 400. It can be seen from FIG. 1 that the electron microscopy system 300 and the ion beam processing system 200 are arranged relative to each other such that both an electron beam 312 and an ion beam 208 can be incident on a same region of the object 400.

The electron beam 312 is generated by an electron beam source comprising a cathode 301, such as a Schottky-Field-Emitter, and an anode 303 opposite to the cathode 301. The electrons emitted from the cathode traverse an extractor 302 arranged between the cathode 301 and the anode 303. Accelerated electrons traverse an aperture provided in the anode 303 and are collimated by a condenser 304. Thereafter, the electron beam traverses a volume 306 in which a detector (not shown in FIG. 1) configured to detect secondary electrons or backscattered electrons can be located. An objective lens 305 having an inner pole piece 309, an outer pole piece 308 and a coil 307 arranged between the pole pieces 308, 309 generates a focusing magnetic field, and electrodes 310 and 311 generate a focusing electrostatic field which also decelerates the electrons of the electron beam 312 before they are incident on the object 400.

The electron microscopy system 300 further comprises a detector and beam deflectors (not shown in FIG. 1) in order to deflect the electron beam and to scan the beam across a region of the surface of the object 400 and to detect secondary electrons and/or backscattered electrons such that electron microscopic images of the surface of the object can be obtained. Such images can be used to monitor and to control a processing of the object using the ion beam processing system 200.

The ion beam processing system 200 comprises an ion source 201 and an extraction electrode 202 for extracting an ion beam from the ion source 201. The ion beam traverses a collimator 203, a variable aperture 204, deflection electrodes 205 and 206, and a focusing lenses 207 in order to focus the ion beam 208 in a region of the surface of the object 400.

A controller 210 is provided to control the generation of the ion beam 208 and a location of incidence of the beam 208 on the surface of the object 400 by energizing the deflection electrodes 205, 206.

The system further comprises a gas supply system 250 configured to supply a process gas from a gas reservoir 252 via a supply conduit 254 to the surface of the object such that the gas exits from the conduit 254 at a location close to locations of incidence of the electron beam 312 and the ion beam 208 on the object 400. The process gas supplied to the surface of the object 400 is activated by the ion beam 208 or the electron beam 312. The activated process gas can react with the material of the object and result in that material is deposited on or removed from the object at the location where the ion beam, or the electron beam, is incident on the object. The depositing of material on the object and the removal of material from the object, respectively, is controlled by the ion beam, or the electron beam, incident on the object.

In certain applications it is desired to remove material from within a predetermined surface portion of the object, or to deposit material within a predetermined surface portion of the object. For this purpose, the ion beam, or the electron beam, has to be scanned across the predetermined surface portion such that a required particle dose per unit area of surface is supplied to those regions of the object where the removal or the deposition of material is desired.

Methods of scanning the surface of the object with the ion beam or the electron beam will be illustrated below. The methods are performed in order to substantially uniformly distribute a required particle dose across a predetermined region of the surface of the object.

Figure 2:
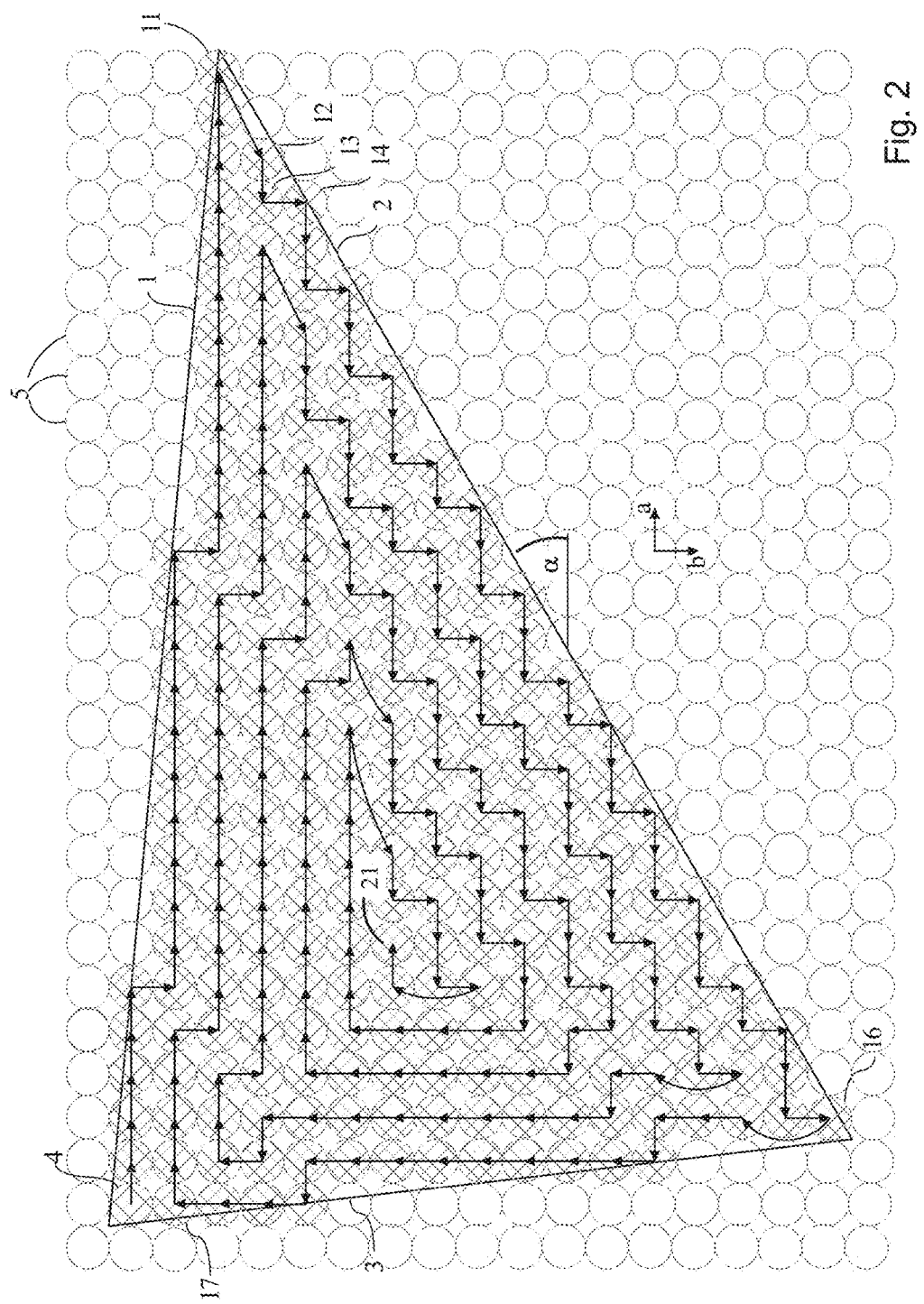
FIGS. 2 to 10 are schematic illustrations of an order of raster points to be scanned according to various embodiments.

FIG. 2 illustrates an embodiment of such method. Lines 1, 2 and 3 represent a contour of the surface portion of the surface of the object to be scanned. This surface portion has a shape of a triangle. Circles 5 in FIG. 2 represent raster points to which the particle beam can be directed. Diameters of the circles are selected such that they correspond to a diameter of the particle beam in a plane of the object surface. In practice, the particle beam will not have a precisely defined cross section in the plane of the object surface. Rather, an intensity distribution of the particle beam incident on the object will have a Gaussian shape, for example. It is common practice to associate a radial distance from the beam center at which the intensity is half of the maximum intensity at the center with the radius of the beam. The centers of the circles 5 shown in FIG. 2 are arranged at distances from each other which are equal to the beam diameter such that the circles 5 do not overlap. In practice, also locations on the object which are not located within one of the circles 5 will receive some particle dose due to the extended beam profile even when the beam is only directed to the centers of the circles 5.

All circles 5 shown in FIG. 2 provide a basic set of raster points. The raster points of the basic set are arranged in a regular two-dimensional rectangular lattice in this embodiment. This lattice can be generated by two lattice vectors a and b oriented orthogonally relative to each other. One single raster point is located in each primitive cell of the lattice. All of the contour lines 1, 2 and 3 extend transverse, i.e. not parallel, to both of the lattice vectors a and b. An angle α shown in FIG. 2 represents the angle between a direction of extension of contour line 2 and lattice vector a. This angle amounts to about 30° and is, in particular, greater than 10° and smaller than 80°.

A set of raster points located within the surface portion is selected from the basic set represented by the circles 5. The selected raster points located within the surface portion are represented by hatched circles in FIG. 5. A predetermined criterion can be used to decide whether a raster point represented by a circle overlapping with one of the contour lines 1, 2 and 3 is located within the surface portion or outside of the surface portion. The criterion applied in the embodiment shown in FIG. 2 determines whether the centre of a circle is inside the surface portion or outside of the surface portion. If the centre of a circle is located within the surface portion or exactly on the contour line of the surface portion, the corresponding raster point is added to the set of selected raster points to be scanned. Other criteria are also possible. According to one exemplary alternative criterion, a raster point is added to the set of selected raster points to be scanned if a predetermined amount of the surface of the circle, for example more than one half of the surface of the circle, is located within the surface portion. In such situation, raster point 11 located on contour lines 1 and 2 would not be added to the set of selected raster points to be scanned.

Subsequent to the determination of the set of selected raster points located within the surface portion to be scanned, an ordered set of raster points is determined by ordering the selected set of raster points. In the example illustrated with reference to FIG. 2, the ordering is performed as follows: a raster point 4 located at the boundary of the surface portion is selected as the first element of the ordered set of raster points. In the illustrated example, this is the top left raster point located in the corner between contour lines 1 and 3. The raster point located to the right of raster point 4 is selected as the second raster point of the ordered set. An arrow between adjacent raster points indicates the selection of the next raster point. The ordered set of raster points is represented by the chain of arrows in FIG. 2, wherein the direction of the arrows represents the ordering relation. The raster point located at the origin of an arrow is located earlier in the ordered set than the raster point located at the tip end of the arrow. In other words, the raster point located at the origin of an arrow is smaller than the raster point located at the tip end of the arrow according to the ordering relation.

Subsequent to the selection of the second raster point located to the right of the first raster point 4, the third, fourth, five and sixth raster point are each selected as the raster point located to the right of each previously selected raster point. Starting with the sixth raster point, a selection of the raster point located to the right of the sixth raster point is no longer possible since this raster point is not a member of the set of selected raster points located within the surface portion to be scanned. Therefore, the raster point located immediately below the sixth raster point is selected as the seventh raster point. Thereafter, the raster point located immediately to the right of the seventh raster point is selected as the eighth raster point. Starting from a given raster point, the next selected raster point is always that raster point which is located immediately adjacent to the given raster point and which is located closest to the contour line 1 of the surface portion, until the raster point 11 is reached which is located at the corner between contour lines 1 and 2.

Starting from raster point 11, raster point 12 is selected as the next raster point, since raster point 12 is the raster point from within the set of raster points located within the surface portion, which has not yet been added to the ordered set of raster points, which is located immediately at the contour line 2 defining the boundary of the surface portion, and which is located closest to the already selected raster point 11. Subsequent to the selection of raster point 12, raster point 13 is selected as the next raster point, since it is located immediately adjacent to the already selected raster point 12 and since it is located close to the boundary of the surface portion. Starting from raster point 13, raster point 14 is selected as the next raster point of the ordered set of raster points, because it is located immediately adjacent to raster point 13 and on the contour line 2 of the surface portion. Such processing is continued until raster point 16 located at the corner between contour lines 2 and 3 of the surface portion is reached. Starting with raster point 16, raster points are subsequently added to the ordered set of raster points which are located on or close to contour line 3, until raster point 17 is reached which is located immediately below the first raster point 4. Between raster point 16 and raster point 17, raster points are added to the ordered set which are located on the contour line 3 of the surface portion to be scanned, or which are located close to the contour line.

The arrows shown in FIG. 2 representing the order of the raster points within the ordered set of raster points are mainly oriented in the clockwise direction about a center of the surface portion.

Subsequent to raster point 17, raster points are selected as the next raster points which are located immediately adjacent to the respective preceding raster point, which have not yet been added to the ordered set of raster points and which are located closest to the contour line 1 of the surface portion to be scanned. This processing is continued by proceeding in the clockwise direction about raster point 21 located at the center of the surface portion, until the center is reached and raster point 21 is added as the last raster point to the ordered set of raster points.

It is a result of the method illustrated above with reference to FIG. 2 that the following holds for about 84% of all possible pairs of raster points Pi, Pj of the ordered set of raster points: if raster point Pi is less than raster point Pj according to the order of the ordered set, the distance of raster point Pi from the boundary of the surface portion is less than the distance of raster point Pj from the boundary of the surface portion. Herein, the distance of the raster point from the boundary of the surface portion is the smallest distance of the raster point from the three contour lines 1, 2 and 3.

Subsequent to the ordering of the set of raster points located within the surface portion to be scanned, the raster points can be scanned using the particle beam, wherein the scanning is performed in an order corresponding to the order of the raster points within the ordered set of raster points. There are two options to perform such scanning: according to the first option, the particle beam is first directed to the first raster point 4 of the ordered set and wherein the particle beam is subsequently directed to each of the remaining raster points in the ordered set according to the order of the ordered set until raster point 21 located at the center of the surface portion is reached such that raster point 21 is the last raster point of the ordered set to which the particle beam is directed. The scanning of the surface portion is performed inwardly from the outside.

According to the second option, the raster points are scanned in the reverse order, such that the particle beam is first directed to raster point 21 located at the center and wherein raster point 4 located at the boundary of the surface portion is the last raster point to which the particle beam is directed. The scanning is performed outwardly from the center.

Figure 3:
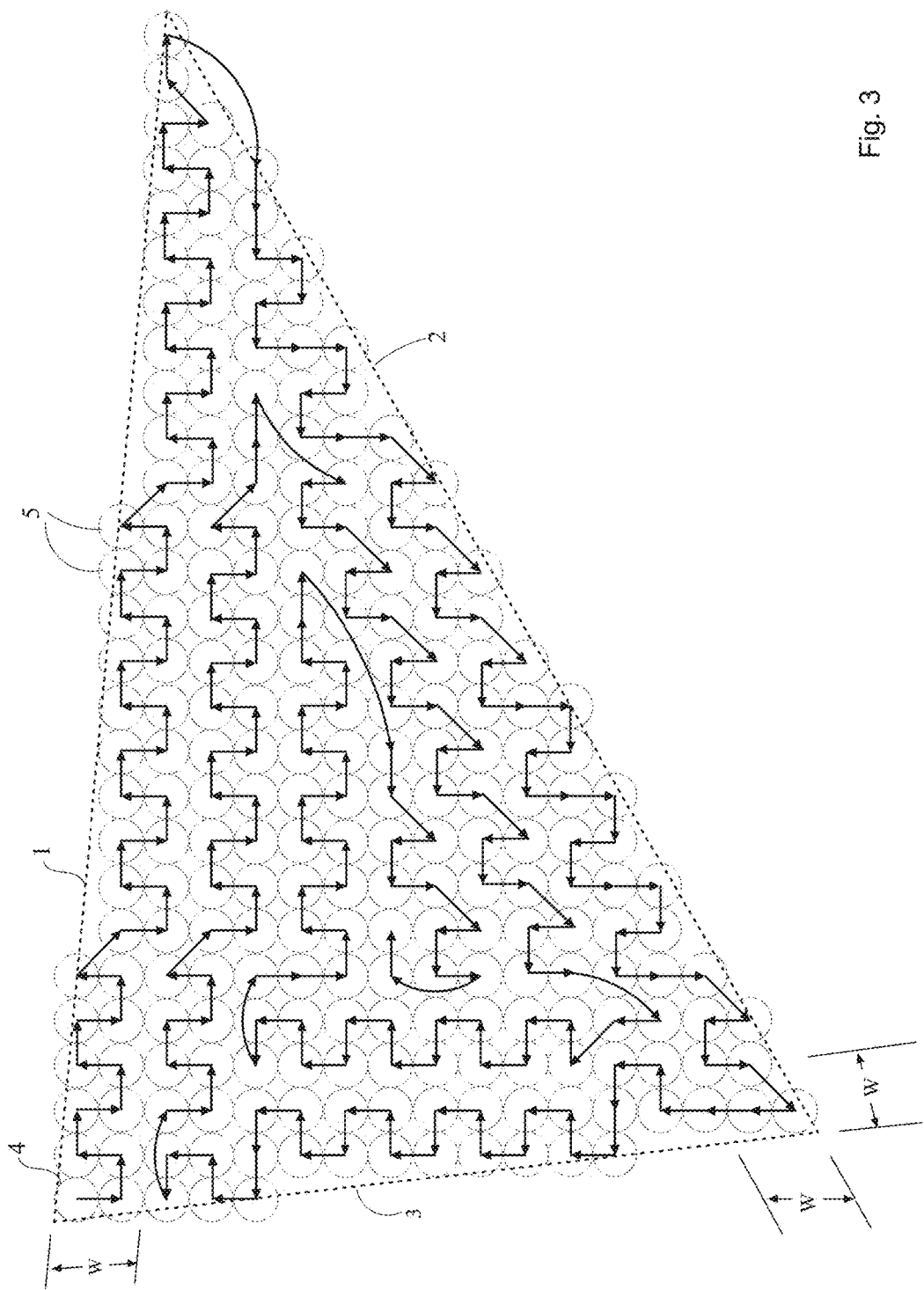

FIG. 3 illustrates a further example of processing for ordering the set of raster points located within the surface portion and which is a variation of the processing illustrated with reference to FIG. 2 above. Those raster points of the basic set of raster points which are not located within the surface portion to be scanned are not shown in FIG. 3. Still, the set of selected raster points which are located within the surface portion to be scanned have been selected out of the basic set in a preceding processing step.

Again, arrows shown in FIG. 3 represent the order of the raster points 5 within the ordered set. Also, raster point 4 located in the corner between contour lines 1 and 3 is the first raster point of the ordered set. While it was always the raster point located on or closest to the boundary of the surface portion and immediately adjacent to a previously selected raster point which was selected as the next raster point in the example illustrated with reference to FIG. 2, the processing is different in the example shown in FIG. 3. It is always one of two raster points which is selected as the next raster point, wherein the two raster points are located closest to the boundary of the surface portion, and wherein the selection is performed such that the processing again occurs in the clockwise direction. Stripes or regions having a width of two raster points and located closest to the boundary of the surface portion are indicated in FIG. 3 as having a width w. It is apparent that raster points are subsequently selected from within a stripe extending in the clockwise direction about the center of the surface portion, wherein the stripe has a width of about two raster points. The direction of extension of the stripe is oriented in the clockwise direction about the center of the surface portion, and, when seen in the direction transverse to the direction of extension of the stripe, the raster points are selected according to a zig-zag-pattern.

In the embodiment illustrated with reference to FIG. 3, the following holds for about 69% of all possible pairs of raster points Pi, Pj of the ordered set: if Pi is smaller than Pj according to the order of the ordered set, the distance of raster point Pi from the boundary is smaller than the distance of raster point Pj from the boundary of the surface portion.

Figure 4:
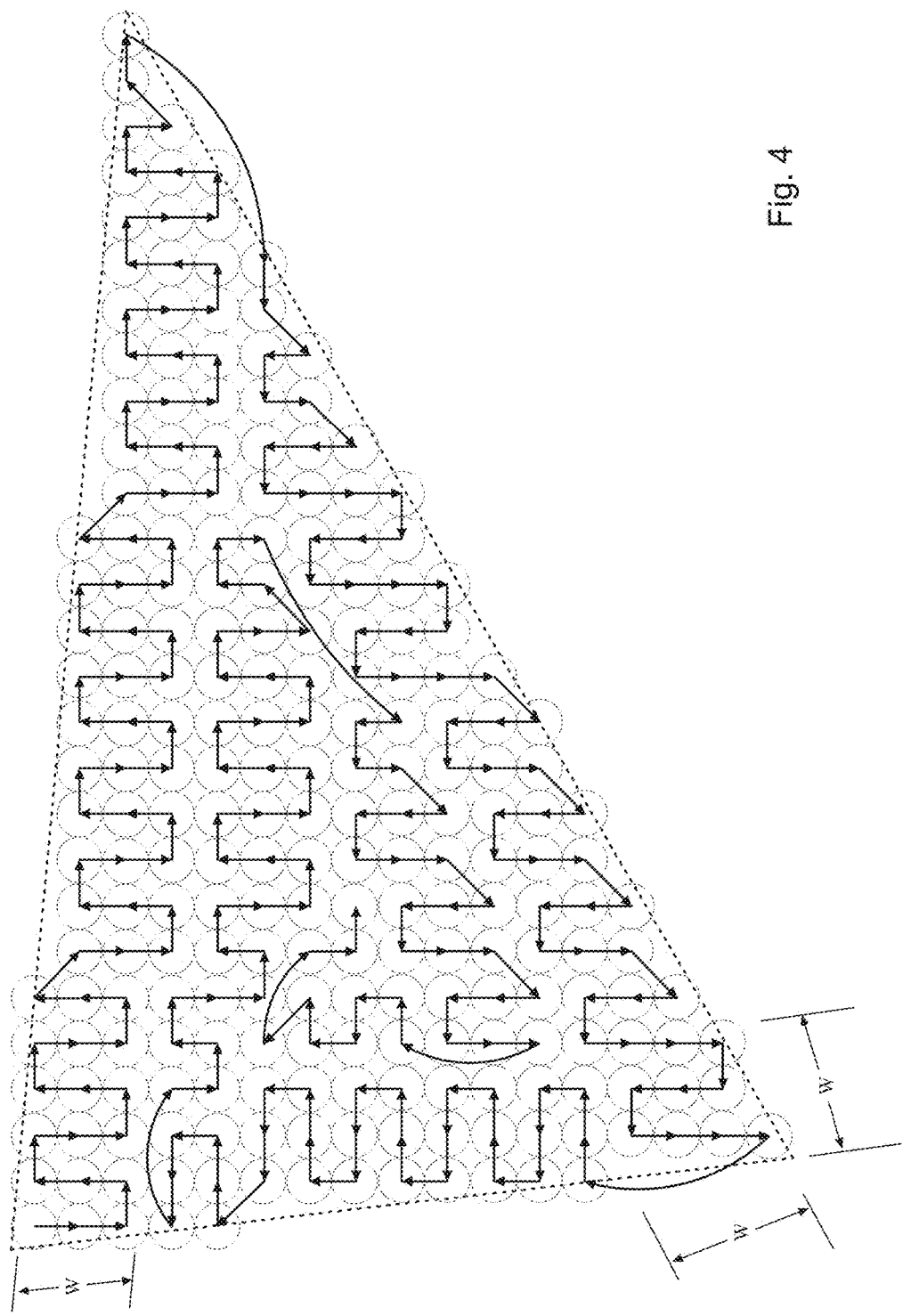

FIG. 4 illustrates a further example of ordering the raster points of the selected set of raster points located within the surface portion to be scanned. Again, raster points of the basic set of raster points which are not members of the selected set of raster points are not shown in FIG. 4. Starting from a currently selected raster point in FIG. 4, the next raster point is selected to be immediately adjacent to the previous raster point, if possible, wherein the selection is performed from three raster points located at three different distances from the boundary of the surface portion. Again, stripes are formed which are oriented in the clockwise direction about the center of the surface portion and which have a width w of three raster points. The scanning proceeds according to a zig-zag-pattern along such stripes.

In the embodiment illustrated with reference to FIG. 4, the following holds for about 56% of all possible pairs of raster points Pi, Pj of the ordered set: if Pi is smaller than Pj according to the order of the ordered set, the distance of raster point Pi from the boundary is smaller than the distance of raster point Pj from the boundary of the surface portion.

Figure 5:
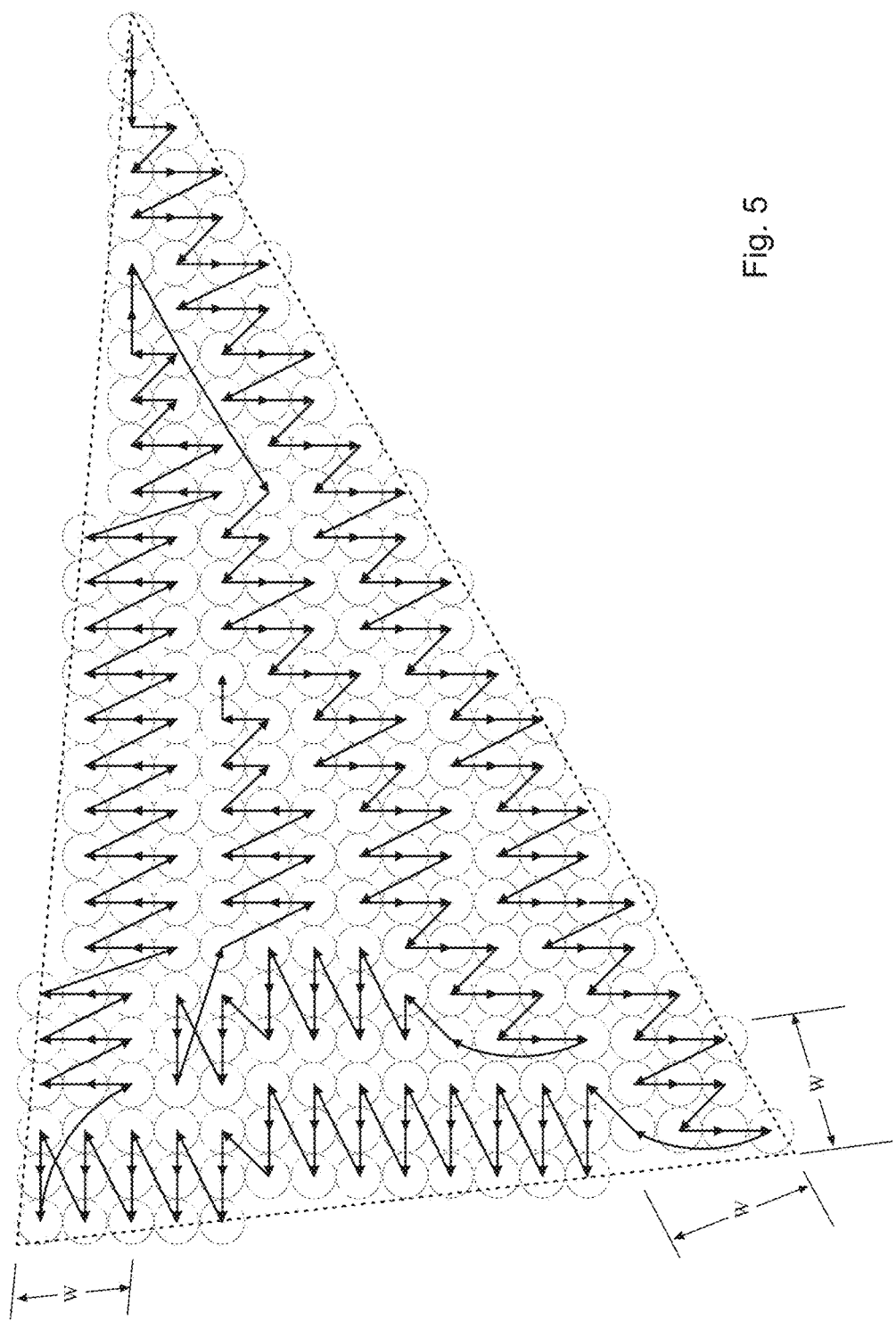

FIG. 5 illustrates a variation of the method illustrated with reference to FIG. 4. According to this variation, the first raster point of the ordered set is located at the top right corner of the surface portion rather than the top left corner. Further, the zig-zag-pattern within the stripes having a width w of about three raster points is modified in that subsequent raster points are selected from right to left, wherein the processing jumps to the raster point located at the right side of the stripe as soon as the left side of the stripe has been reached. In FIG. 4 the processing is performed back and forth between the right and left sides.

Figure 6:
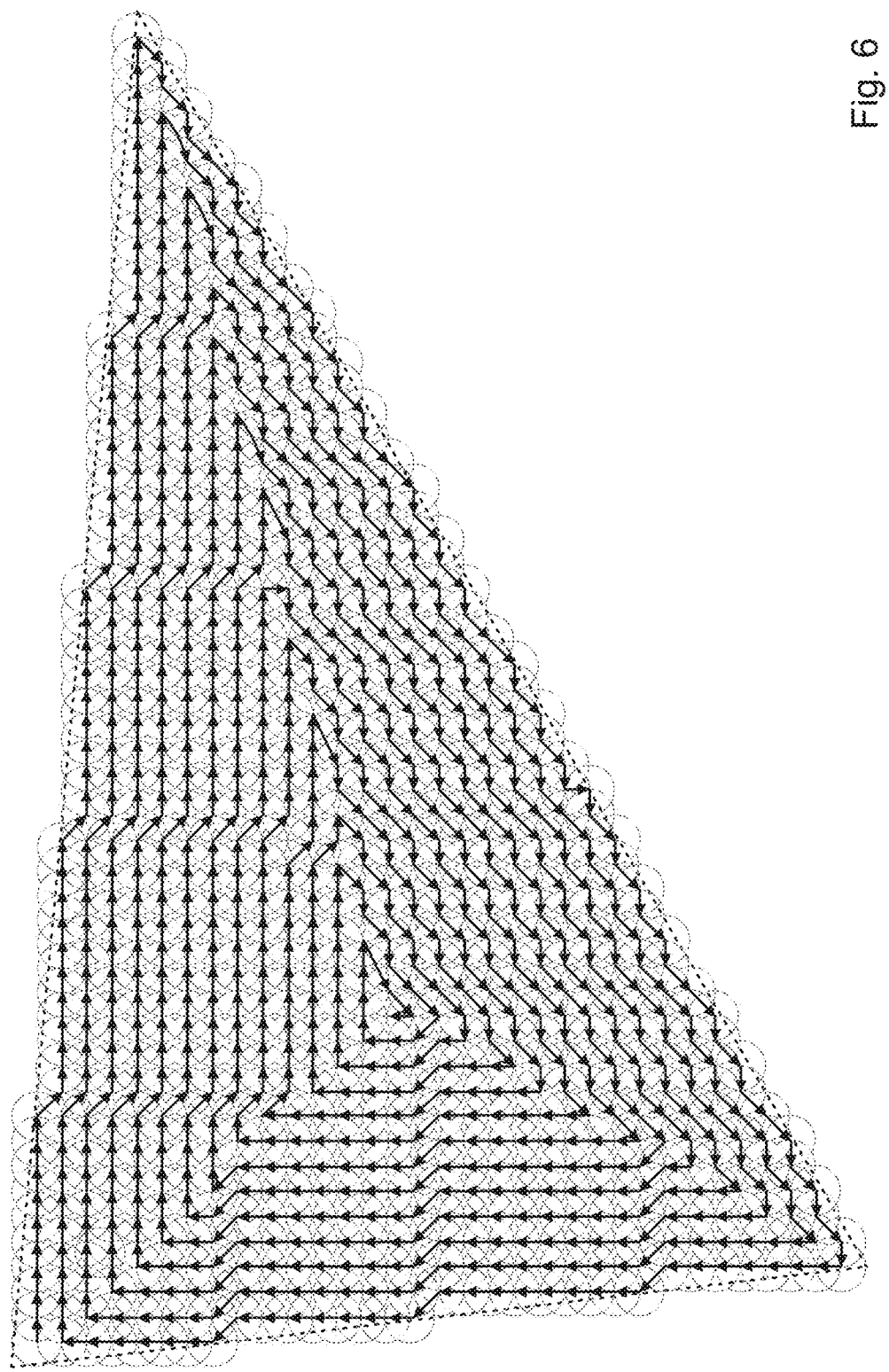

FIG. 6 illustrates a further alternative of the examples shown in FIGS. 2 to 5. According to this alternative, the basic set of available raster points is not determined such that the distance between adjacent raster points is equal to the beam diameter. In the example shown in FIG. 6, the distance between adjacent raster points is one half of the beam diameter. Such determination of the basic set of raster points allows for a more uniform distribution of the particle intensities across the surface portion as compared to the examples of FIGS. 2 to 5. The raster points of the basic set shown in FIG. 6 are also arranged in a regular two-dimensional rectangular lattice.

Due to the overlap of the circles it is possible to more precisely define the boundaries of the surface portion to be scanned when the boundary extends in a direction transverse to the lattice vectors. For example, the edge of the surface portion along the contour line 1 of FIG. 2 has three steps. The edge of the surface portion arranged along the corresponding contour line in FIG. 6 has five steps, such that there is a better correspondence between the achieved edge of the surface portion to be scanned and the desired contour of the boundary represented by line 1 in FIG. 2.

The selection of subsequent raster points of the ordered set of raster points in the example of FIG. 6 is performed similar to the example of FIG. 2 in that, starting from a currently selected raster point, the next raster point is selected such that, if possible, it is located immediately adjacent to the current raster point and immediately at the boundary of the surface portion.

Figure 7:
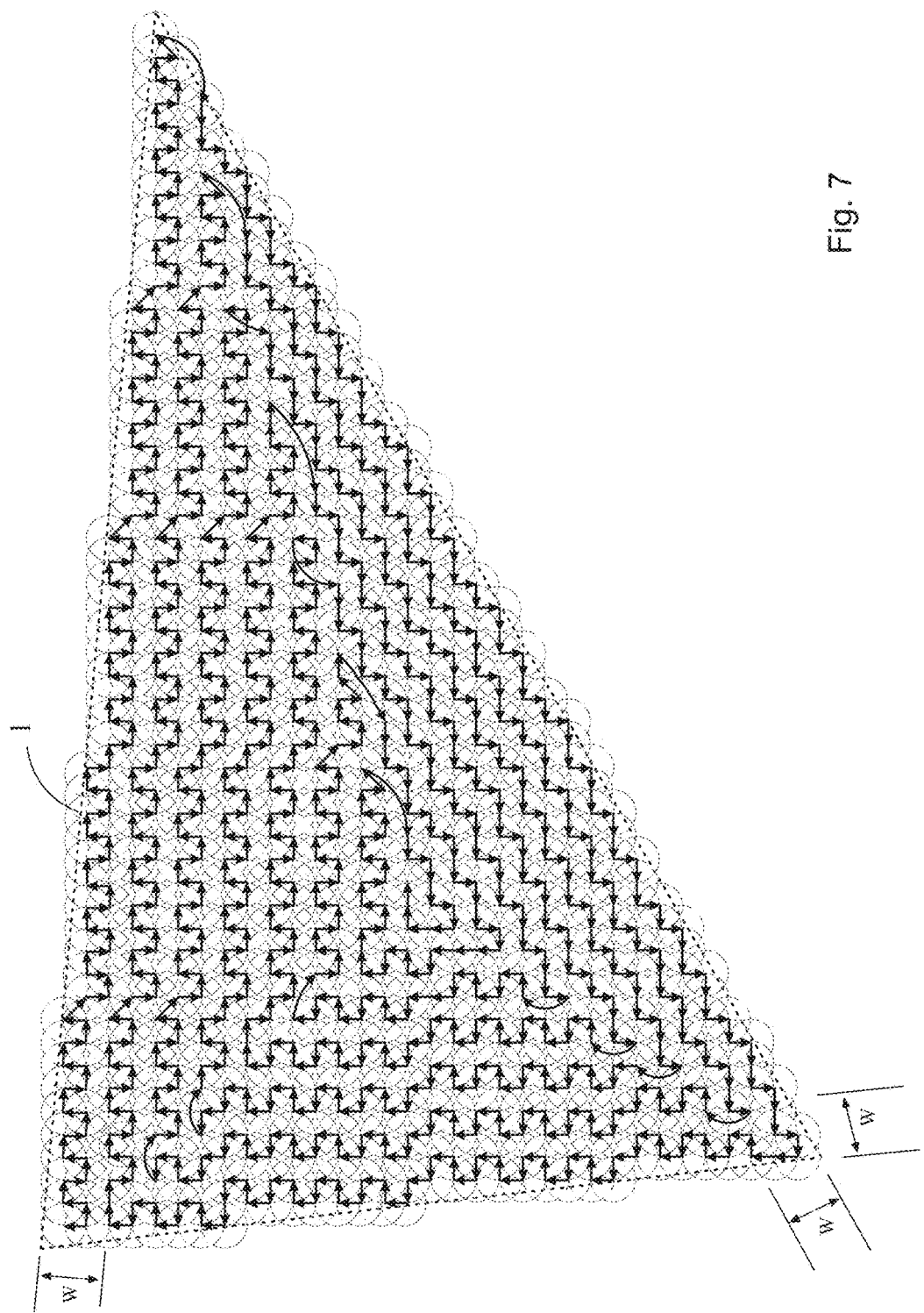

FIG. 7 shows an example which is similar to FIG. 6 in that a distance between adjacent raster points is half of the beam diameter, and which is similar to FIG. 3 in that the processing proceeds according to a zig-zag-pattern along stripes having a width w of about two raster points.

Figure 8:
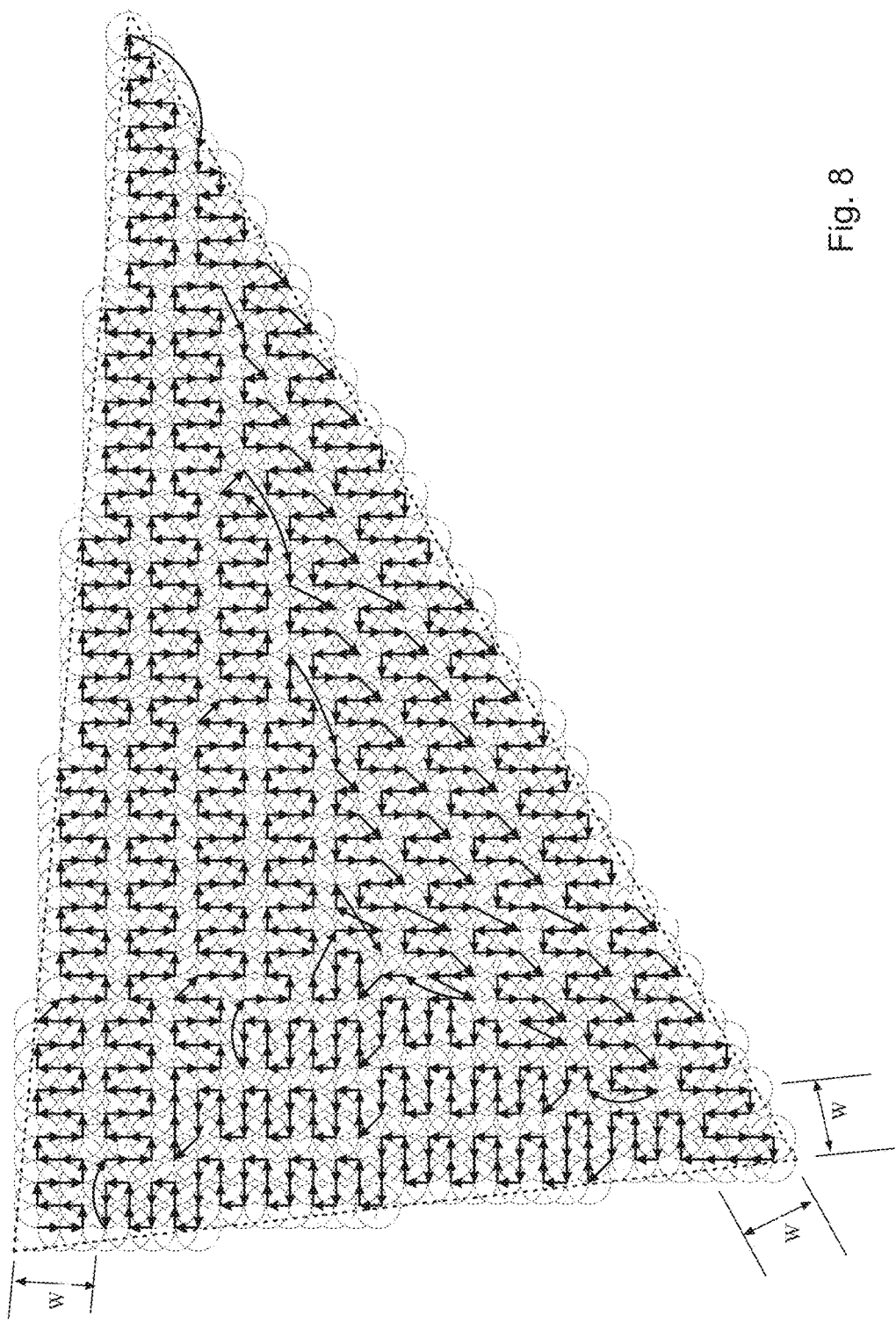

FIG. 8 shows an example similar to FIG. 7 and which has been modified relative to the example of FIG. 7 in that the processing is performed according to a zig-zag-pattern along stripes having a width w of three raster points rather than two raster points.

Figure 9:
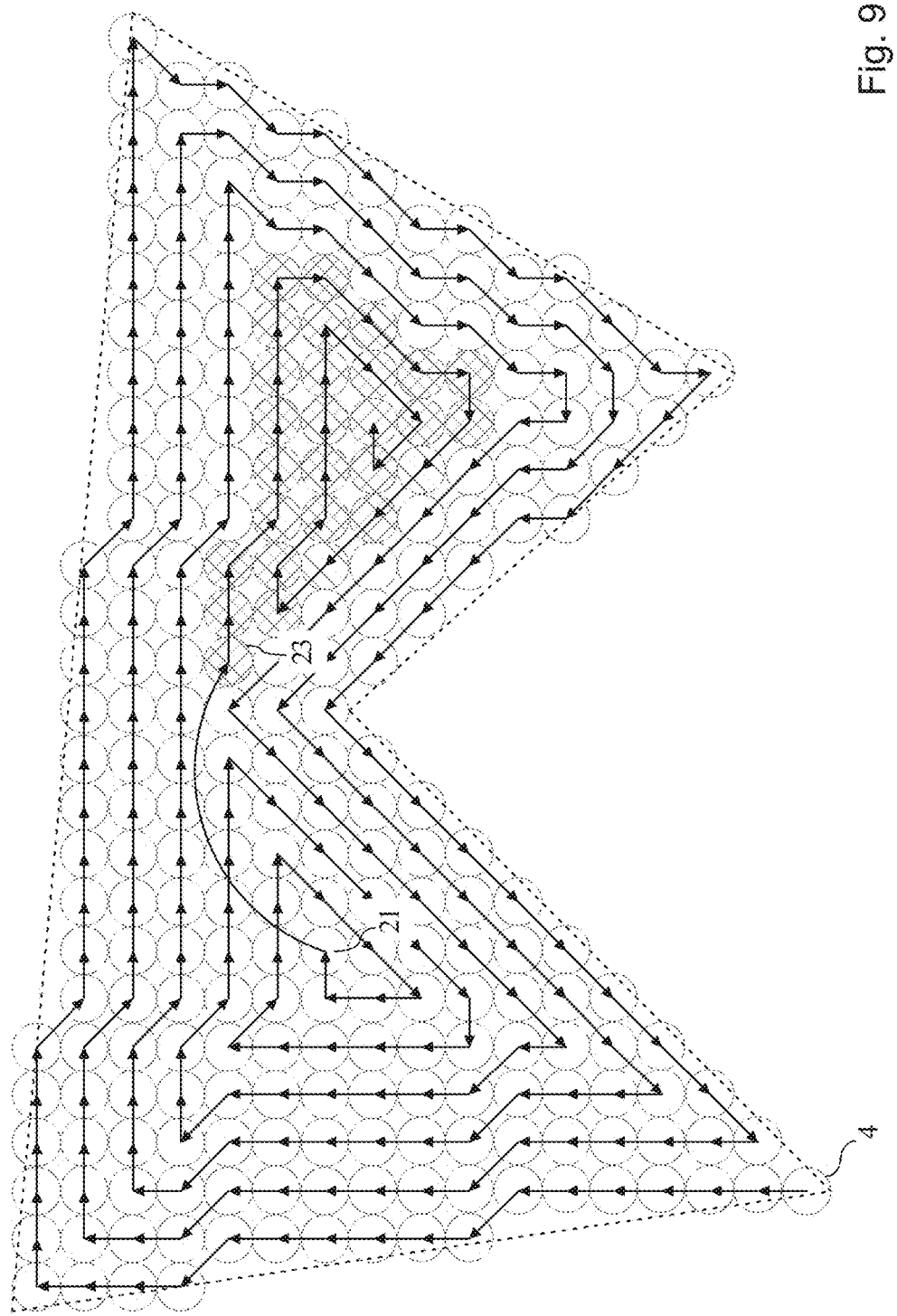

FIG. 9 shows an embodiment in which the surface portion to be scanned does not have a convex shape while the triangular shape of the surface portion shown in FIGS. 2 to 8 is a convex shape. The selection of respective next raster points in FIG. 9 is performed according to the same rules as applied in the example of FIG. 2. A raster point located in the bottom left corner of the surface portion is the first raster point of the ordered set. The next raster point is always selected such that it is immediately adjacent to the previous raster point and located, if possible, closest to the boundary of the surface portion. Such processing is continued until raster point 21 located in the center of the left portion of the surface portion to be scanned is reached.

As soon as raster point 21 is reached, there is no further raster point available in the selected set of raster points which is immediately adjacent to raster point 21. Still, there is a remaining group of raster points of the selected set of raster points which have not yet been added to the ordered set of raster points. This group of raster points is hatched in FIG. 9. However, this group of raster points can be handled as if they were the selected raster points of a separate surface portion to be scanned. A raster point located on the boundary of the separate surface portion is selected as the first raster point of this surface portion. In FIG. 9, it is raster point 23 which is selected as the first raster point of this separate surface portion and as the next raster point selected subsequent to raster point 21. The remaining raster points of the hatched group of raster points are processed according to the same rules as applied to the raster points from raster point 4 to raster point 21.

Figure 10:
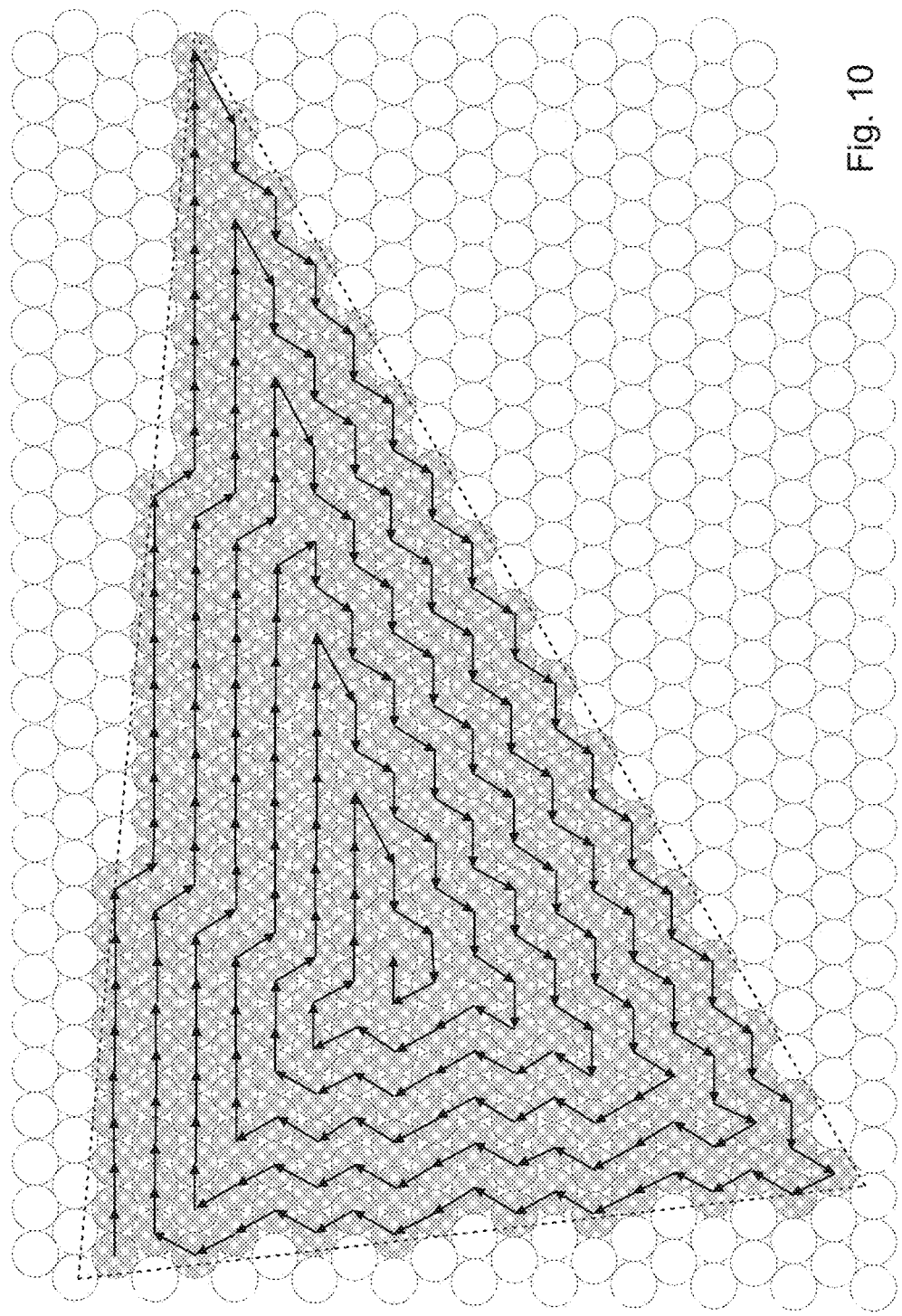

FIG. 10 illustrates an example in which the basic set of raster points is arranged in a two-dimensional hexagonal array rather than in a two-dimensional rectangular array. Again, those raster points located within the surface portion to be scanned are first selected from the basic set. The set of selected raster points is hatched in FIG. 10. Thereafter, the selected set of raster points is ordered, wherein a raster point located at the boundary of the surface portion to be scanned is selected as the first raster point of the ordered set. Thereafter, subsequent raster points are selected such that they are immediately adjacent to the previously selected raster point and closest to the boundary of the surface portion.

The examples illustrated above with reference to FIGS. 2 to 10 have in common that the raster points are ordered from the outside to the inside. This means, that a raster point of a pair of raster points located later according to the order of the ordered set has a greater distance from the boundary of the surface portion than the other raster point of the pair located earlier according to the order.

Figure 11:
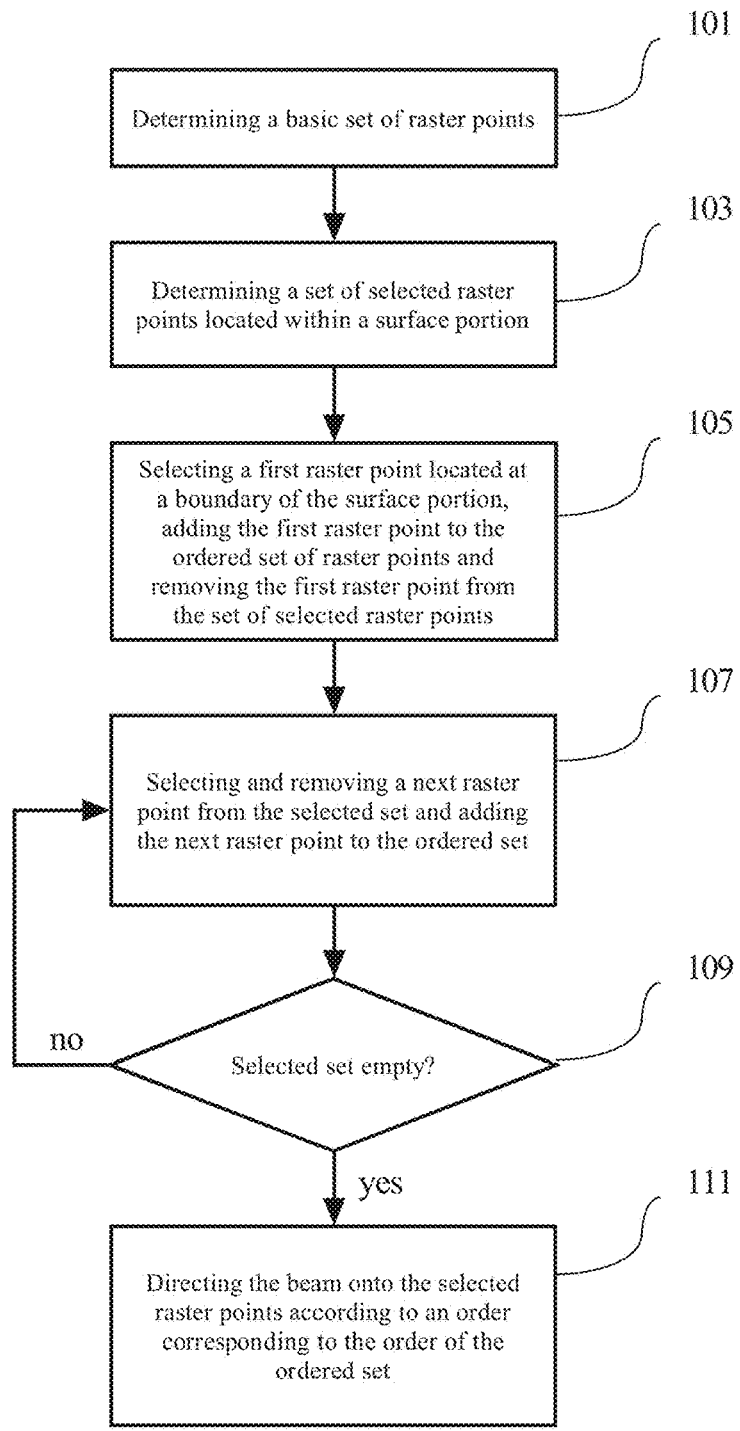
FIG. 11 is a flow chart illustrating a method of scanning of a surface of an object using a particle beam.

The methods illustrated above with reference to FIGS. 2 to 10 are summarized below with reference to the flow chart of FIG. 11.

A basic set of raster points is first selected in a step 101. In a step 103, those raster points of the basic set are selected which are located within the surface portion of the object to be scanned. A raster point located on the boundary of the surface portion is selected, removed from the selected set of raster points determined in step 103 and added as the first raster point to an ordered set of raster points in a step 105. Thereafter, a processing step 107 and a decision step 109 are repeated until the decision step 109 provides a predetermined result. In the processing step 107, a next raster point is selected and removed from the selected set of raster points determined in step 103. The raster point removed from the selected set is added to the ordered set of raster points as the next raster point. In the decision step 109 it is determined whether the selected set of raster points determined in step 103 is empty since raster points are repeatedly removed from this set in step 107. If the ordered set is not empty, the processing continues with step 107. If the ordered set is empty, the processing continues at step 111 in which the surface of the object is scanned by directing the particle beam to the raster points in an order corresponding to the order of the ordered set of raster points.

Summarized, a method of raster scanning a surface of an object using a particle beam comprises determining a basic set of raster points within a surface; determining a surface portion of the surface of the object, wherein the surface portion is to be raster scanned; ordering a set of raster points of the basic set located within the surface portion; and scanning of the surface portion by directing the particle beam onto the raster points of the ordered set in an order corresponding to an order of the raster points in the ordered set from the outside to the inside, i.e. starting from the boundary of the surface portion towards its center, or in the reverse order, i.e. from the inside to the outside.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A method of raster scanning a surface of an object, the method comprising:
   using a particle beam source that generates an output consisting of a single particle beam;
   determining a basic set of raster points within the surface;
   after determining the basic set of raster points within the surface, determining a boundary of a two-dimensional surface portion of the surface of the object, wherein the entire two-dimensional surface portion is to be raster scanned by the single particle beam;
   determining an ordered set of raster points based on a shape of the two-dimensional surface portion by sequentially ordering all raster points of the basic set which are located within the two-dimensional surface portion, wherein for more than 50% of all pairs of raster points Pi and Pj of the ordered set, a distance between raster point Pi and a respective closest edge of the boundary of the two-dimensional surface portion is smaller than a distance between raster point Pj and a respective closest edge of the boundary of the two-dimensional surface portion, wherein the raster point Pi is earlier in the ordered set than the raster point Pj; and
   sequentially directing the single particle beam to the ordered set of raster points within the two-dimensional surface portion in an order that is the same as an order of the raster points in the ordered set of raster points, or in an order that is reversed of the order of the raster points in the ordered set of raster points.

2. The method according to claim 1, wherein the raster points are arranged in a regular two-dimensional lattice having two lattice vectors, wherein a boundary of the surface portion to be scanned has at least one region in which an angle between a direction of extension of the boundary and each of the lattice vectors is greater than 10° and smaller than 80°.

3. The method according to claim 1, wherein the raster points are not arranged in a regular two-dimensional lattice.

4. The method according to claim 3, wherein distances between adjacent raster points are randomly varied.

5. The method according to claim 1, wherein the scanning comprises directing the particle beam to each of the raster points located within the surface portion a same number of times.

6. The method according to claim 1, wherein the single particle beam is directed to the ordered set of raster points within the two-dimensional surface portion in an order that is the same as the order of the ordered set of raster points such that the raster point Pi is scanned before the raster point Pj.

7. The method according to claim 1, wherein the single particle beam is directed to the ordered set of raster points within the two-dimensional surface portion in an order that is reversed of the order of the raster points in the ordered set of raster points such that the raster point Pi is scanned after the raster point Pj.

8. The method according to claim 1, wherein the scanning comprises directing the particle beam onto each of the raster points during a predetermined first duration.

9. The method according to claim 8, wherein the scanning comprises moving the particle beam from one raster point to the next subsequent raster point during a second duration, wherein the second duration is shorter than the first duration.

10. The method according to claim 1, further comprising supplying a process gas to the surface during the raster scanning of the surface portion.

11. The method according to claim 1, wherein the particle beam comprises one of an electron beam and an ion beam.

12. The method according to claim 1, where the ordered set of raster points within the two-dimensional surface portion comprises more than 100 raster points.

13. The method according to claim 1, where the ordered set of raster points within the two-dimensional surface portion comprises more than 1000 raster points.

14. The method according to claim 1, wherein a raster point located on the boundary of the two-dimensional surface portion is added as a first raster point to the ordered set.

15. The method according to claim 1, wherein the basic set of raster points is arranged in a two-dimensional hexagonal array.

16. The method according to claim 1, wherein the basic set of raster points is arranged in a two-dimensional rectangular array.

17. The method according to claim 1, further comprising removing material from the object within the surface portion, wherein the scanning the surface results in a well defined edge of removed material at the object.

* * * * *

UNITED STATES PATENT AND TRADEMARK OFFICE
CERTIFICATE OF CORRECTION

PATENT NO.        : 10,279,419 B2
APPLICATION NO.   : 13/741677
DATED             : May 7, 2019
INVENTOR(S)       : Josef Biberger and Ralph Pulwey Page 1 of 1

It is certified that error appears in the above-identified patent and that said Letters Patent is hereby corrected as shown below:

In the Specification

Column 2, Line 20: Delete "a an" and insert -- an --, therefor.

Signed and Sealed this
Thirteenth Day of August, 2019

Andrei Iancu
*Director of the United States Patent and Trademark Office*